(12) United States Patent
Gombert et al.

(10) Patent No.: US 10,335,955 B2
(45) Date of Patent: Jul. 2, 2019

(54) PROXIMITY SENSOR ARRANGEMENT

(71) Applicant: ABB gomtec GmbH, Seefeld (DE)

(72) Inventors: Bernd Gombert, Wörthsee (DE);
Werner Hösl, Nabburg (DE);
Alexander Wolff, Radeburg (DE);
Richard Andrysek, Dießen a.A (DE);
Leopid Krausen, München (DE)

(73) Assignee: ABB SCHWEIZ AG, Baden (CH)

( * ) Notice: Subject to any disclaimer, the term of this patent is extended or adjusted under 35 U.S.C. 154(b) by 144 days.

(21) Appl. No.: 15/514,964

(22) PCT Filed: Sep. 24, 2015

(86) PCT No.: PCT/EP2015/001903
§ 371 (c)(1),
(2) Date: Mar. 28, 2017

(87) PCT Pub. No.: WO2016/050344
PCT Pub. Date: Apr. 7, 2016

(65) Prior Publication Data
US 2018/0236667 A1    Aug. 23, 2018

(30) Foreign Application Priority Data
Sep. 29, 2014   (DE) .................. 10 2014 014 050

(51) Int. Cl.
*G06F 3/044*   (2006.01)
*B25J 13/08*   (2006.01)
(Continued)

(52) U.S. Cl.
CPC ............ *B25J 13/086* (2013.01); *B25J 19/06* (2013.01); *H03K 17/955* (2013.01); *H03K 2217/960765* (2013.01)

(58) Field of Classification Search
CPC ......... B25J 13/08; B25J 19/06; H03K 17/955; G06F 3/04; G06F 3/0416; G06F 3/044
See application file for complete search history.

(56) References Cited

U.S. PATENT DOCUMENTS

| 5,166,679 A | 11/1992 | Vranish |
| 5,539,292 A | 7/1996 | Vranish |
| 2013/0241280 A1 | 9/2013 | Hoyer et al. |

FOREIGN PATENT DOCUMENTS

| DE | 102005003492 | 8/2006 |
| JP | 200105126 | 2/2001 |

(Continued)

OTHER PUBLICATIONS

International Search Report and Written Opinioin for PCT Application PCT/EP2015/001903, dated Jan. 22, 2016, EPO.

*Primary Examiner* — Neel D Shah

(57) ABSTRACT

The invention relates to a proximity sensor arrangement (1) comprising a substrate (2), a circuit board (4) carrying contact surfaces (35, 37) which is mounted on a surface (3) of the substrate (2) and at least one support (5) which carries contact surfaces (36, 38) complementary to the contact surfaces (35, 37) of the circuit board (4) and at least one proximity sensor (7) with a measuring electrode (8) and a shield electrode (9) extending between measuring electrode (8) and surface (3). In order to bring the contact surfaces (35, 36, 37, 38) of the circuit board (4) and of the support (5) into contact, the substrate (2) and support (5) are plug-connected in a plugging direction (R, L) running parallel to the surface (3) of the substrate (2).

18 Claims, 4 Drawing Sheets

(51) Int. Cl.
*H03K 17/955* (2006.01)
*B25J 19/06* (2006.01)

(56) References Cited

FOREIGN PATENT DOCUMENTS

| WO | WO 2006025000 | 3/2006 |
| WO | WO 2011124752 | 10/2011 |
| WO | WO 2013093326 | 6/2013 |

PROXIMITY SENSOR ARRANGEMENT

TECHNICAL FIELD

The invention relates to a proximity sensor arrangement for detecting objects approaching said arrangement.

BACKGROUND FIELD

The patent specification U.S. Pat. No. 5,166,679 discloses a capacitive proximity sensor which can detect objects penetrating into its field. The proximity sensor has a measuring electrode on a flexible circuit board and a shield electrode arranged opposite the measuring electrode. The shield electrode serves to shield the measuring electrode against interference fields, which can affect the function of the measuring electrode, and causes a reduction in stray fields in that the measuring field of the measuring electrode is concentrated in a direction facing away from the shield electrode.

In order to make possible a reproducible measurement, the electrodes must have an unchangeable form, and for this purpose the flexible circuit board must be fixed on a solid substrate. Measuring signals must be conducted away via an exposed outer side of the circuit board. The contacts necessary for this purpose can, expediently, be established via a plug connection, but if the circuit board lies on the substrate, then the plug connector necessary for this purpose must project from the exposed outer side, which makes the assembly bulky and sensitive to mechanical damage.

The invention is therefore based on the problem of creating a proximity sensor arrangement which is space-saving and robust.

SUMMARY

The problem addressed by the invention is solved through a proximity sensor arrangement comprising
  a substrate, for example a robot arm,
  a circuit board carrying contact surfaces which is mounted on a surface of the substrate, and
  at least one support which carries contact surfaces complementary to the contact surfaces of the circuit board and at least one proximity sensor,
the proximity sensor comprising a measuring electrode which is connected with the contact surfaces and a shield electrode extending between the measuring electrode and the surface of the substrate, whereby, in order to bring the contact surfaces of the circuit board and of the support into contact, the substrate and the support are plug-connected in a plugging direction running parallel to the surface.

This plug connection can be established in different ways. According to a first approach, the support itself can be plugged onto the substrate, so that in the plug-connected state it embraces it in a frictionally- and/or form-locking manner.

According to a second approach, the plug connection between substrate and support can be established indirectly, via the circuit board, in that the contact surfaces are parts of complementary electrical plug connectors provided on the support and on the circuit board.

In both cases, due to the surface parallel plugging direction, a long plugging travel distance can be accommodated in a narrowly limited construction space over the surface of the substrate. In particular, the height of this construction space can be smaller than the length of the plugging travel distance.

Since the mechanical plug connection also establishes an electrical contact with the proximity sensor, assembly of the arrangement is simplified.

Also, a defective proximity sensor can be replaced simply, without requiring any cabling, by plugging in another support with an intact proximity sensor.

The contact surfaces of the circuit board and of the support are advantageously oriented or extended in the plugging direction. In this way, an electrical contact can be ensured despite tolerances in the positioning of the support.

For example, one of the contact surfaces can be designed as an electrically conductive spring which, when plugging in the support, is pushed onto a complementary contact surface and, in that it deforms elastically, contributes to the frictional locking of the plugged connection.

The support advantageously has a rigid base plate and the measuring electrode and the shield electrode are arranged on opposite surfaces of the base plate.

The rigid base plate offers a basis for fixing of the electrodes as a whole and lends the proximity sensor arrangement stability, in particular with respect to detachment phenomena affecting the proximity sensors caused by vibrations and oscillations. The electrodes can be applied to the support by means of vapour deposition, printing or galvanisation.

In addition, the base plate can be used as an insulator which separates the measuring electrode from the shield electrode.

One of the complementary plug connectors can comprise a margin of the base plate or of the circuit board, whereby the contact surfaces can be contact pads arranged on the margin. These contact fields can be realised economically during the manufacture of the base plate or circuit board using known mass production techniques, the installation of a plug connector component on the base plate or the circuit board thus becoming unnecessary. In order to be able to receive the margin, the other plug connector must overlap with the margin in a direction perpendicular to the surface of the substrate, which results in a further minimisation of the projection beyond the substrate. If the contact surfaces are located on the margin of the base plate, the measuring and shield electrodes can be applied to the base plate over a wide area and free of interruptions by any components.

Preferably, one of the contact pads is formed in a single piece with the measuring electrode and another is formed in a single piece with the shield electrode. In this way, the electrodes and the contact pads can, expediently, be formed in a single working operation.

The base plate can have projections projecting beyond the surface carrying the shield electrode. The projections keep the shield electrode at a distance from the substrate and prevent the shield electrode and the possibly conductive substrate from short-circuiting.

At least one of the projections can be a rib running along one edge of the shield electrode. In this way, the projection can serve as an insulator against a further shield electrode which is arranged adjacent to the first shield electrode and on the same surface as this.

The support can be secured to the substrate by at least one screw.

A bore in the base plate, which can receive such a screw, preferably runs through one of the projections. In this way, it is ensured that the shield electrode cannot be pressed against the substrate when the screw is tightened.

The screw is preferably oriented transversely to the plugging direction. In this way, it cannot cause any relative movement between the contact surfaces when the screw is tightened.

The support is preferably formed as a trough extending in a longitudinal direction. This allows the support at least partially to embrace the substrate.

If the shield electrode is applied to an inner side of the trough facing the substrate and the measuring electrode is applied to an outer side of the trough facing away from the substrate, then the shield electrode can shield the measuring electrode against interference from the substrate.

Preferably, the proximity sensor arrangement has at least two supports which complement one another to form a sleeve enclosing the substrate in a tubular manner. In this way, it is possible, in a simple manner, to distribute proximity sensors around the entire periphery of the substrate in order to detect the approach of foreign bodies from all directions.

The measuring electrodes and the shield electrodes of the proximity sensors preferably extend in a transverse direction from one edge of the support to an opposite edge. In this way, in particular in the case of a tubular arrangement of supports a uniform sensitivity over the entire circumference of this arrangement can be achieved.

If only a single proximity sensor is applied to the support, the point which is being approached by an object cannot be localised exactly. Several proximity sensors should therefore be distributed on the support in the longitudinal direction. In this way, the point which is being approached by an object can be recognised on the basis of which proximity sensor responds most strongly to the object.

A plurality of contact surfaces can be distributed along the circuit board in order to make contact with the plurality of proximity sensors.

The circuit board preferably has two groups of contact surfaces, and two supports are plug-connected with the substrate from opposite plugging directions.

Preferably, the measuring electrodes of the proximity sensors are narrower in the longitudinal direction than the shield electrodes. This allows the measuring electrode to be better protected by the shield electrode against interference originating in the substrate.

The detection range of each proximity sensor is limited. Therefore, according to a further development of the invention, a switch is provided by means of which a plurality of proximity sensors can be connected in parallel. In this case, the parallel-connected proximity sensors act like a single proximity sensor; that is to say, it is no longer possible to distinguish which of the parallel-connected proximity sensors is first approached by an approaching object. However, this measure has the effect that the range of the detection zone of the parallel-connected proximity sensors is extended (in comparison with non-parallel-connected proximity sensors), allowing an approaching object to be detected from a greater distance.

The parallel connection can be partially or wholly undone by means of the switch. While this reduces the range of the detection zone of the proximity sensors again, from the greater number of available proximity sensors the ones which are first approached by the object can be identified.

On detection of an object, a first preventive measure can be initiated. For example, the speed of the robot can be reduced.

BRIEF DESCRIPTION OF THE DRAWINGS

These and other features and advantages of the present invention will be better understood by reading the following detailed description, taken together with the drawings wherein.

DETAILED DESCRIPTION OF THE PREFERRED EMBODIMENTS

Figure 1:
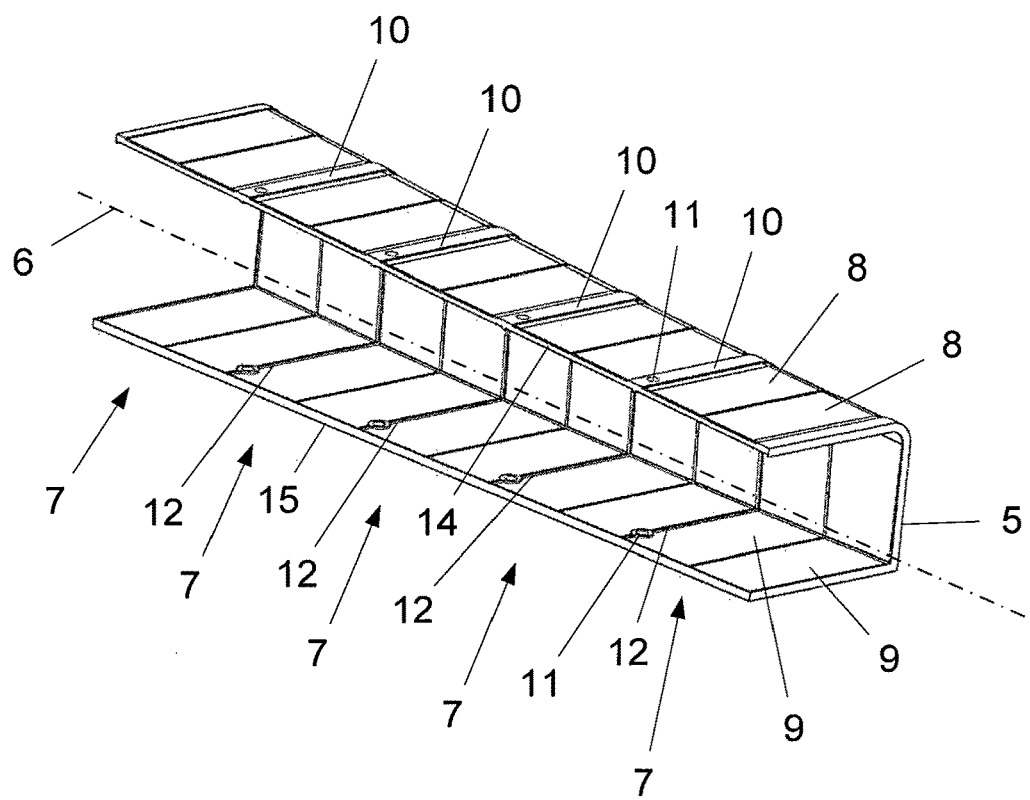
FIG. 1 shows a support with proximity sensors.

FIG. 1 shows a support 5. The support 5 is designed as a trough which extends in a longitudinal direction 6 and is u-formed in cross section. Several proximity sensors 7 are firmly attached to the support 5. Each proximity sensor 7 comprises a measuring electrode 8 and a shield electrode 9.

Measuring and shield electrodes 8 and 9 are firmly connected with the support 5 and can for example be adhesively bonded thereto. In a preferred alternative, the electrodes are applied to the support 5 by means of galvanisation or vapour deposition.

The measuring electrodes 8 are applied to an outer side of the trough-shaped support 5, spaced in the longitudinal direction, and extend in the transverse direction over the entire width of the outer side, from an upper edge 14 to a lower edge 15. The shield electrodes 9 are applied to an inner side of the trough-shaped support 5 and also extend over its entire width from edge 14 to edge 15. The support 5 is thus virtually covered by the measuring and shield electrodes 8 and 9.

In comparison with the shield electrodes 9, the measuring electrodes 8 are designed to be narrower in the longitudinal direction, so that each shield electrode 9 projects laterally, in the longitudinal direction, beyond the measuring electrode 8 opposed to it. This means that the shield electrodes 9 also shield the edges of the measuring electrodes 8 against interference fields emanating from the substrate 2.

The support 5 located between the shield electrodes 9.1, 9.2 and the measuring electrodes 8.1, 8.2 is formed of an insulating material, typically injection-moulded out of plastic, thus electrically isolating the shield and measuring electrodes.

On the inner side of support 5, there is a plurality of projections 12, designed in the form of ribs, which extend between the shield electrodes 9 of two adjacent proximity sensors 7. By projecting inwards beyond the shield electrodes 9, the ribs 12 hold open a cavity 18 between these and the substrate 2 and thus ensure a galvanic isolation of the shield electrodes 9 from the substrate 2. Optionally, the cavity 18 can be filled with an insulating material.

In this case the outer side of the trough-shaped support 5 has further projections 10, designed in the form of ribs, which project outwards beyond the measuring electrodes 8. The projections 10 are arranged between two proximity sensors 7 and act like an insulator, in that they separate measuring electrodes 8 of the two adjacent proximity sensors 7 from one another. The projections 10 are also arranged opposite the projections 12.

The projections 10 carry a housing 17 which protects the measuring electrodes 8 against making direct contact with objects approaching the proximity sensors 7. They keep open an air-filled cavity 19 between the measuring electrodes 8 and the housing 17.

According to a variant, which is not shown, the support 5 is flat on its outer side and, instead of the housing, as a protection for the measuring electrodes 8, a flexible film is drawn over the outer side and is adhesively bonded or welded to the support 5 between two adjacent measuring electrodes 8, or a coating of varnish is applied to the measuring electrodes 8 and support 5.

Figure 2:
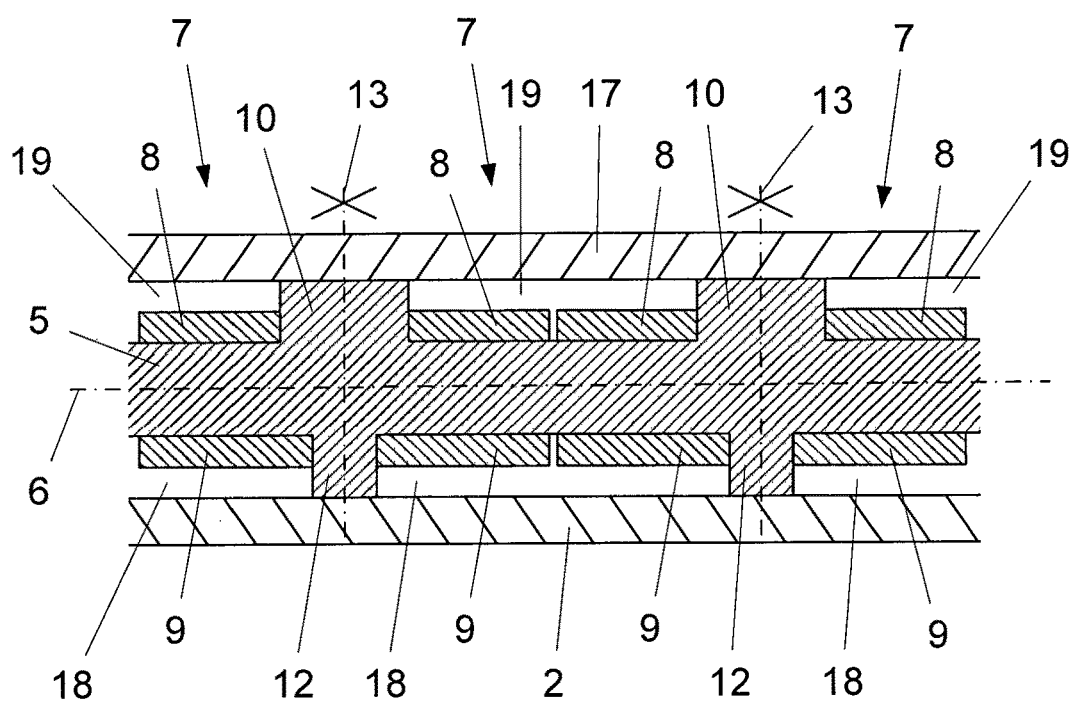
FIG. 2 shows a sectional view of a proximity sensor arrangement.

Bores 11 (see FIG. 1) run through the projections 10 and 12 transversely to the longitudinal direction 6 of the support 5. Screws 13 (see FIG. 2) can be introduced through the bores 11 in order to fix the support 5, possibly together with the housing 17, to the substrate 2.

The substrate 2 can be earthed (i.e. at earth potential, "grounded") in order to conduct away currents.

Figure 3:
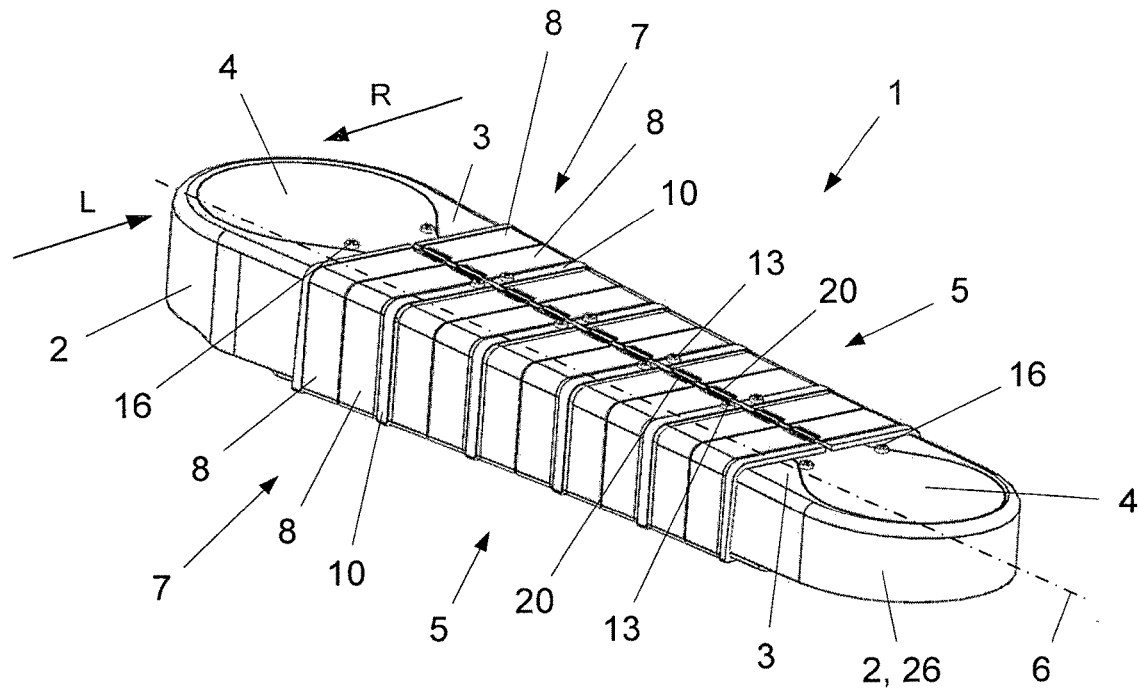
FIG. 3 shows a substrate enclosed by two supports.

FIG. 3 shows a proximity sensor arrangement 1 which comprises the substrate 2, in this case in the form of an arm element 26 of a robot arm, two supports 5 equipped with proximity sensors 7, and a circuit board 4. The supports 5 embrace the substrate 2 in frictional engagement in that one support 5 is pushed on from one direction L and the other support is pushed on from an opposite direction R until their inner projections 12 rest against the substrate 2 on all sides. The two trough-shaped supports 5 thus combine to form a tubular structure and surround the substrate 2, extending in a longitudinal direction 6 so that the substrate 2 is surrounded on all sides by shield electrodes 9 and measuring electrodes 8 of the proximity sensors 7.

The circuit board 4 is screwed firmly to a surface 3 of the substrate 2 with screws 16. The circuit board 4 can include all circuit components which are required for the signal processing of the proximity sensors 7. It includes in particular several pairs of springs 20 for establishing electrical connections with the electrodes 8, 9 on the supports 5.

Figure 4:
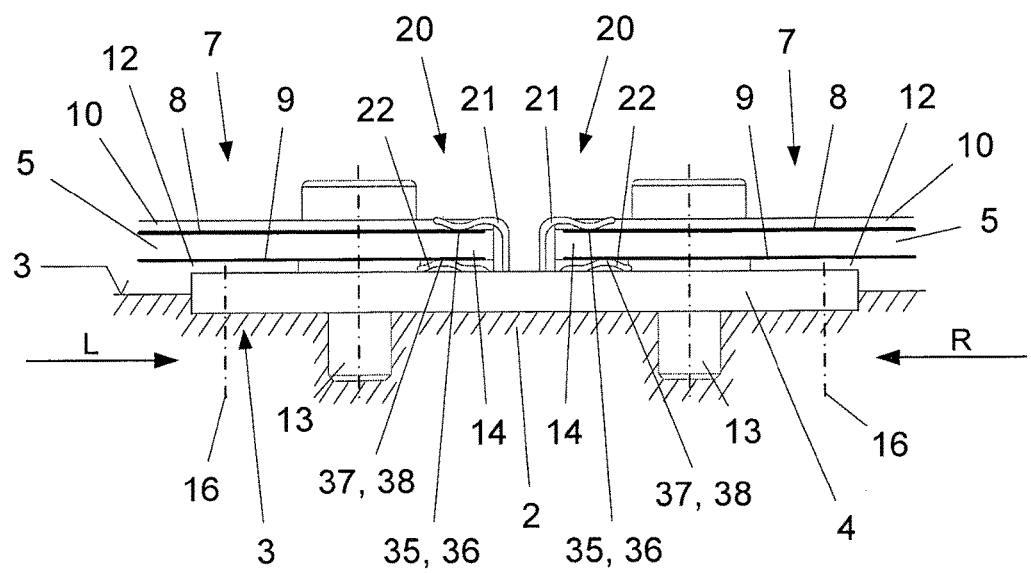
FIG. 4 shows a detailed view of plug connections.

FIG. 4 shows two pair of springs 20 in an enlarged section. The left-hand pair of springs 20 serves to plug in the support 5 pushed on in the plugging direction. L and the right-hand pair of springs 20 serves to plug in the other support 5 pushed on in the plugging direction R.

Each pair of springs 20 comprises an upper spring 21 and a lower spring 22 arranged beneath it which are soldered onto the circuit board 4 and which together form the limits of a plug-in groove. The plug-in groove of the left-hand pair of springs 20 is open to the left and clamps the upper margin 14 of the left-hand support 5 pushed on in the plugging direction L. The plug-in groove of the right-hand pair of springs 20 is open to the right and clamps the upper margin 14 of the right-hand support 5 pushed on in the plugging direction R.

The springs 21 and 22 thus apply a clamping force to the support 5 plugged between them, which connects the support 5, in a friction-locking manner, with the circuit board 4 or with the substrate 2 connected to the circuit board 4.

On the other hand, the springs 21 and 22 serve as contact surfaces 35, 37 of the circuit board 4 which can be connected in an electrically conductive manner with corresponding contact surfaces 36, 38 of the support 5, so that one of the margins 14 forms a male plug connector and the pair of springs 20 which receives it forms a complementary female plug connector. The contact surfaces 36, 38 are arranged in a row along the upper margins 14 of the supports 5. As FIG. 4 shows, an electrical contact is established with one of the measuring electrodes 8 of the support 5 via the upper spring 21, and an electrical contact is established with one of the shield electrodes 9 of the support via the lower spring 22, i.e.

the measuring and shield electrodes 8, 9 extending into the margin 14 of the support 5 are at the same time used as contact surfaces 36, 38 of the support.

Figure 5:
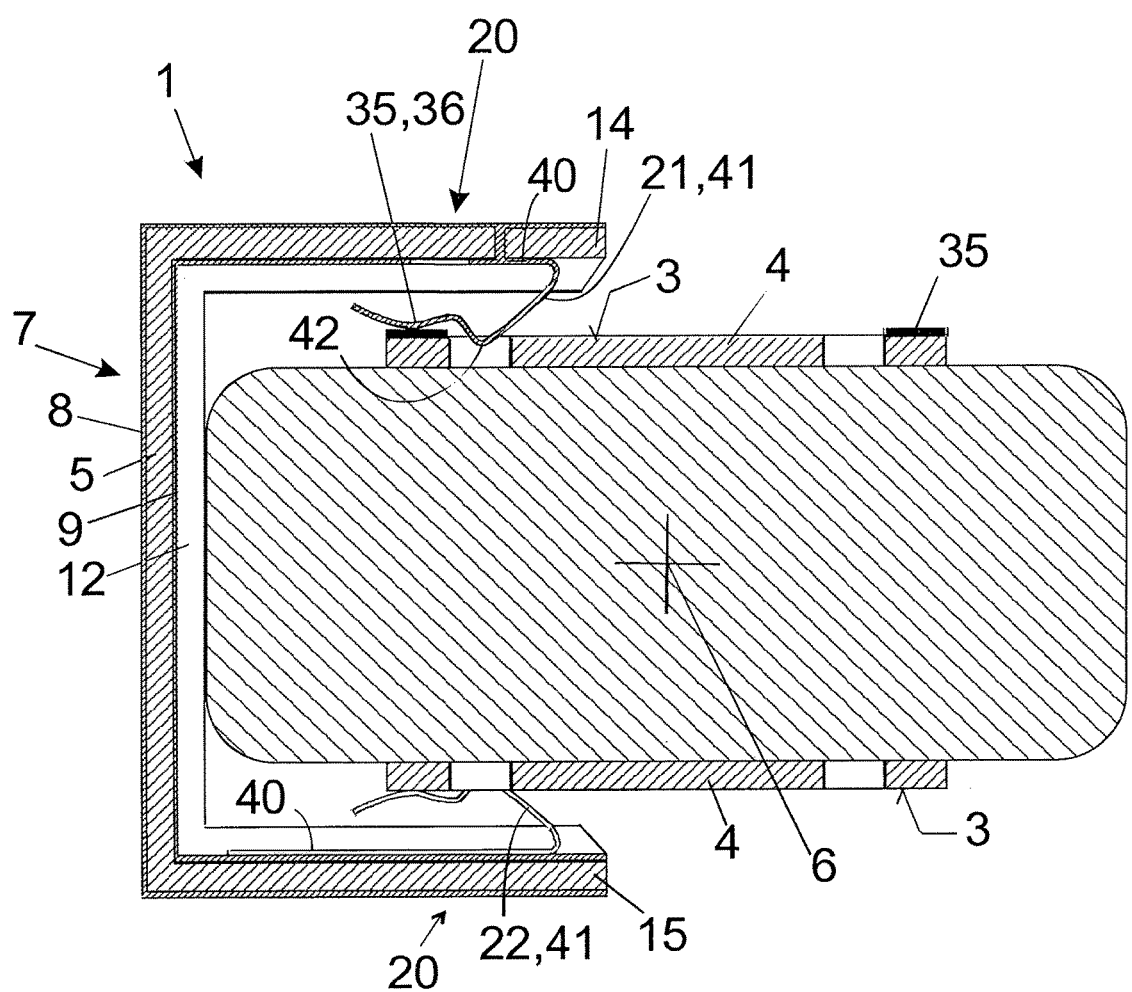
FIG. 5 shows a support connected with the substrate in a form-locking manner and FIG. 6 shows a robot equipped with the supports.

As an alternative to the friction-locking connections, FIG. 5 shows a support 5 connected in a form-locking manner with the substrate 2. The support 5 is plugged onto the substrate 2 in the plugging direction L. A spring 21 is fixed to the inner side of the support 5 at its upper margin 14 and a further spring 22 is fixed at its lower margin 15. The springs 21 and 22 lie opposite two circuit boards 4 which are fixed to the upper and lower sides of the substrate 2.

The circuit boards 4 are congruent and are provided with recesses or openings 39 along their edges running perpendicular to the section plane in FIG. 5. At least one of the circuit boards 4, in this case the upper circuit board 4, has a contact surface 35 between each opening 39 and the adjacent edge.

The springs 21 and 22 are hairpin-formed, in each case with one leg 40 which lies flat against the inner side of the support and one leg 41 which is bent into several corrugations, which legs are connected to form a single piece via a bend facing the margin 14. When the support 5 is pushed onto the substrate 2 in the plugging direction L up to the limit stop, a corrugation 42 of the bent leg snaps into one of the openings 39 in the two circuit boards 4, creating a form-locking connection. A second corrugation forms a contact surface 36 which, when the spring snaps into one of the openings 39, also establishes an electrical contact with the contact surface 35 of the upper circuit board adjacent to the opening 39.

The shield electrode 9 has a cut-out in the region of the spring 21, shown in section in FIG. 5, so that no electrical contact takes place between it and this spring 21. Instead, the spring 21 is connected conductively with the measuring electrode arranged on the outside of the support 5 via a through-connection 43, i.e. a solder-filled bore in the support 5. A further spring, which in the perspective view of FIG. 5 is hidden behind the spring 21 which is shown, is soldered directly onto the shield electrode 9. Since both electrodes of each proximity sensor 7 are thus in contact with the upper circuit board 4, a wiring-up of the lower circuit board 4 can be omitted; the spring 22 simply serves to fix the support 5 in position.

Figure 6:
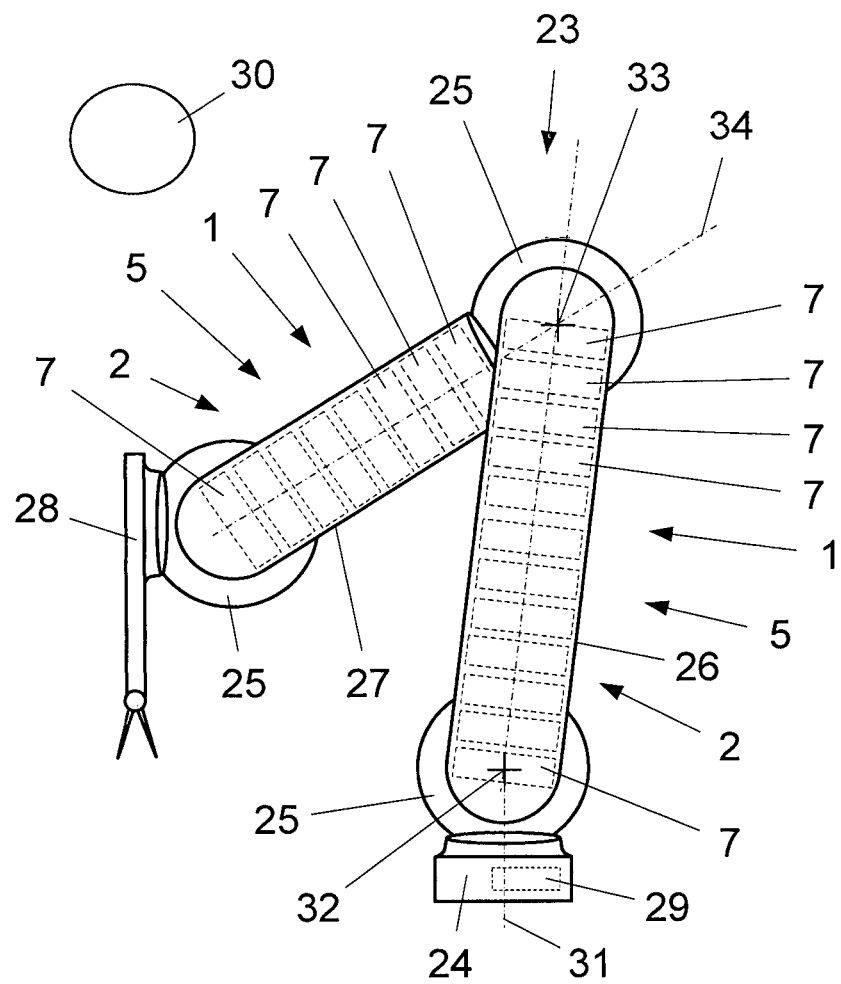

The support 5 according to the invention is suitable for subsequently equipping existing systems with proximity sensors. As shown in FIG. 6, the support 5 can be plugged and/or screwed onto arm elements 26 or 27 of a robot 23. The arm elements 26 and 27 in each case serve as a substrate 2 extending in a longitudinal direction, as shown for example in FIG. 3. The circuit board 4 is screwed onto a surface of the arm element 26 or 27 serving as a substrate 2. The support 5 can then be pushed onto the arm element 26 or 27 and plugged into the pair of springs 20 on the circuit board 4.

The supports 5 are manufactured to match the length of the two arm elements 26 and 27, so that proximity sensors 7 are distributed on the two arm elements 26 and 27 over their entire length. In FIG. 6, outlines of the proximity sensors 7 are indicated with broken lines.

The robot 23 can move its arm elements 26 and 27 in different directions. The lower arm element 26 is mounted, by means of an articulated joint unit 25, so as to be rotatable, relative to a fixed base 24, around a vertical first axis 31 and around a second axis 32 which, in the configuration shown here, is perpendicular to the drawing plane. The upper arm element 27 is mounted, by means of a further articulated joint unit 25, so as to be rotatable, relative to the lower arm element 26, around a third axis 33 parallel to the second axis and around a fourth axis 34 running in its longitudinal direction. An instrument 28 is also mounted, by means of a further articulated joint unit 25, so as to be rotatable relative to the upper arm element 27.

If an object 30 comes within the detection range of at least one of the proximity sensors 7 located on the arm elements 26 and 27, this proximity sensor 7 generates a signal and passes it to a control unit 29 which can be housed in the base 24. The control unit 29 can then initiate a suitable safety measure to avert a collision of the robot 23 with the object 30 and for example stop a movement of the robot 23.

Proximity sensors on the two arm elements 26, 27, in particular ones in the vicinity of the articulated joint unit 25, can also detect one another if they approach one another as a result of swivelling around the third axis 33. At least on the arm element 26, the plugging directions R, L are oriented parallel to the third axis 33, so that the proximity sensors of one of the two supports 5 mounted on the arm element 26 face away from the other arm element 27 and are not interfered with by it.

In order to increase the extent of the detection range of the proximity sensor arrangement 1, the control unit 29 can connect in parallel the proximity sensors 7 located on the same support 5, all together or in groups of adjacent proximity sensors 7, in order to create a combined sensor with a larger electrode surface. Once an object 30 has been detected by such a combined sensor, the parallel connection can be undone, completely or in parts.

Although this reduces the range again, the point on the arm elements 26 or 27 being approached by the object 30 can be localised more precisely, since the non-parallel-connected proximity sensors can detect objects independently of one another.

REFERENCE NUMBERS 1 proximity sensor arrangement
2 substrate
3 surface
4 circuit board
5 support
6 longitudinal direction
7 proximity sensor
8 measuring electrode
9 shield electrode
10 projection
11 bore
12 projection
13 screw
14 margin
15 margin
16 screw
17 housing
18 cavity
19 cavity
20 pair of springs
21 spring
22 spring
23 robot
24 base
25 articulated joint unit
26 arm element
27 arm element
28 instrument
29 control unit
30 object
31 axis
32 axis
33 axis
34 axis
35 contact surface
36 contact surface
37 contact surface
38 contact surface
39 opening
40 leg
41 leg
42 corrugation Modifications and substitutions by one of ordinary skill in the art are considered to be within the scope of the present invention, which is not to be limited except by the allowed claims and their legal equivalents.

The invention claimed is:

1. A proximity sensor arrangement comprising:
a substrate;
a circuit board carrying contact surfaces which are mounted on a surface of the substrate; and
at least one support which carries contact surfaces complementary to the contact surfaces of the circuit board, and at least one proximity sensor, the proximity sensor comprising a measuring electrode and a shield electrode extending between the measuring electrode and the surface,
wherein the substrate and support are configured for being plug-connected in a plugging direction running parallel to the surface of the substrate, and wherein plug connecting said substrate and support is configured to bring the contact surfaces of the circuit board and of the support into contact.

2. The proximity sensor arrangement according to claim 1, characterized in that the contact surfaces of the circuit board and of the support are extended in the plugging direction.

3. The proximity sensor arrangement according to claim 1, characterized in that the support embraces the substrate in a friction-locking and/or form-locking manner.

4. The proximity sensor arrangement according to claim 1, characterized in that the contact surfaces are parts of complementary electrical plug connectors of the support and the circuit board which establish the plug connection between substrate and support.

5. The proximity sensor arrangement according to claim 4, characterized in that the support has a rigid base plate and wherein the measuring electrode and the shield electrode are arranged on opposite surfaces of the base plate.

6. The proximity sensor arrangement according to claim 5, characterized in that one of the complementary plug connectors comprises a margin of the base plate or of the circuit board and wherein the contact surfaces are contact pads arranged on the margin.

7. The proximity sensor arrangement according to claim 6, characterized in that one of the contact pads is formed in a single piece with the measuring electrode and another is formed in a single piece with the shield electrode.

8. The proximity sensor arrangement according to claim 6, characterized in that the base plate has projections which extend beyond the surface carrying the shield electrode.

9. The proximity sensor arrangement according to claim 8, characterized in that at least one of the projections is a rib running along an edge of the shield electrode.

10. The proximity sensor arrangement according to claim 8, characterized in that a bore passing through the base plate runs through at least one of the projections.

11. The proximity sensor arrangement according to claim 1, characterized in that the support is secured to the circuit board by means of at least one screw oriented transversely to the plugging direction.

12. The proximity sensor arrangement according to claim 1, characterized in that the support is shaped as a trough extending in a longitudinal direction.

13. The proximity sensor arrangement according to claim 12, characterized in that two supports complement one another to form a sleeve enclosing the substrate in a tubular manner.

14. The proximity sensor arrangement according to claim 12, characterized in that the measuring electrode and shield electrode of the proximity sensor extend in a transverse direction from one edge of the support to an opposite edge.

15. The proximity sensor arrangement according to claim 12, characterized in that the measuring electrodes of the proximity sensors are narrower in the longitudinal direction than the shield electrodes.

16. The proximity sensor arrangement according to claim 1, characterized in that a plurality of proximity sensors are distributed on the support in a longitudinal direction.

17. The proximity sensor arrangement according to claim 16, characterized in that contact surfaces for contacting the plurality of proximity sensors are distributed along the circuit board.

18. The proximity sensor arrangement according to claim 16, characterized in that the circuit board has two groups of contact surfaces and that two supports are plug-connected with the substrate from opposite plugging directions.

* * * * *